US011402754B2

(12) United States Patent
Gondaira et al.

(10) Patent No.: US 11,402,754 B2
(45) Date of Patent: Aug. 2, 2022

(54) PHOTOSENSITIVE RESIN COMPOSITION, SOLDER RESIST FILM USING SAID PHOTOSENSITIVE RESIN COMPOSITION, FLEXIBLE PRINTED WIRING BOARD, AND IMAGE DISPLAY DEVICE

(71) Applicant: ARISAWA MFG. CO., LTD., Joetsu (JP)

(72) Inventors: Takashi Gondaira, Joetsu (JP); Makoto Tai, Joetsu (JP)

(73) Assignee: ARISAWA MFG. CO., LTD., Niigata (JP)

( * ) Notice: Subject to any disclaimer, the term of this patent is extended or adjusted under 35 U.S.C. 154(b) by 720 days.

(21) Appl. No.: 16/462,147

(22) PCT Filed: Apr. 21, 2017

(86) PCT No.: PCT/JP2017/016112
§ 371 (c)(1),
(2) Date: May 17, 2019

(87) PCT Pub. No.: WO2018/092330
PCT Pub. Date: May 24, 2018

(65) Prior Publication Data
US 2019/0332011 A1    Oct. 31, 2019

(30) Foreign Application Priority Data

Nov. 18, 2016 (JP) .............................. JP2016-225507

(51) Int. Cl.
| H05K 1/02 | (2006.01) |
| H05K 3/00 | (2006.01) |
| G02B 5/32 | (2006.01) |
| G03C 1/76 | (2006.01) |
| G03F 7/027 | (2006.01) |
| G03F 7/033 | (2006.01) |
| G03F 7/038 | (2006.01) |
| C07F 1/08 | (2006.01) |
| C08F 2/46 | (2006.01) |
| G03F 7/028 | (2006.01) |
| G03F 7/085 | (2006.01) |
| H05K 1/03 | (2006.01) |
| H05K 1/09 | (2006.01) |
| H05K 3/28 | (2006.01) |

(52) U.S. Cl.
CPC .............. *G03F 7/028* (2013.01); *G03F 7/085* (2013.01); *H05K 1/0393* (2013.01); *H05K 1/095* (2013.01); *H05K 3/287* (2013.01)

(58) Field of Classification Search
CPC ........ H05K 1/02; H05K 1/0271; H05K 1/095; H05K 1/0393; H05K 3/00; H05K 3/0058; H05K 3/287; G02B 5/32; G03C 1/76; G03C 1/7614; G03C 1/853; G03F 7/027; G03F 7/033; G03F 7/038; C07F 1/08; C08F 2/46; C08F 229/00; C08F 229/06; H04N 5/225

USPC ...... 430/270.1, 2, 523, 527; 428/195.1, 323; 522/78
See application file for complete search history.

(56) References Cited

U.S. PATENT DOCUMENTS

| 4,086,209 | A | * | 4/1978 | Hara | ...................... | C08G 69/48 |
| | | | | | | 528/211 |
| 2002/0081539 | A1 | * | 6/2002 | Ito | .......................... | G03C 1/853 |
| | | | | | | 430/527 |
| 2010/0041785 | A1 | * | 2/2010 | Ohashi | .................. | C08F 299/06 |
| | | | | | | 522/78 |
| 2010/0112460 | A1 | * | 5/2010 | Satou | ................. | G11B 7/24038 |
| | | | | | | 430/2 |
| 2010/0209697 | A1 | * | 8/2010 | Bowles | ..................... | G02B 1/11 |
| | | | | | | 428/323 |
| 2011/0021679 | A1 | | 1/2011 | Takahashi et al. | | |
| 2013/0183499 | A1 | * | 7/2013 | Kido | ....................... | G03F 7/027 |
| | | | | | | 428/195.1 |

(Continued)

FOREIGN PATENT DOCUMENTS

| CN | 1755524 | 4/2006 |
| CN | 101535896 | 9/2009 |

(Continued)

OTHER PUBLICATIONS

Office Action issued for the Japanese Patent Application No. 2018-551018, dated Nov. 17, 2020, 3 pages including machine translation.
Yasushi Goto, "Anisotropic Conductive Film", Professional Report, vol. 89, No. 05, 436-437, p. 52-57, May 2007, Japan, with partial English Translation.
The Written Opinion for corresponding international application PCT/JP2017/016112 dated Aug. 1, 2017.

(Continued)

*Primary Examiner* — Xiaoliang Chen
(74) *Attorney, Agent, or Firm* — Hamre, Schumann, Mueller & Larson, P.C.

(57) ABSTRACT

The present invention provides a photosensitive resin composition from which a dry resist film having excellent resilience, storage stability and heat resistance can be produced. The photosensitive resin composition according to the present invention includes a photosensitive prepolymer having a carboxyl group and an ethylenically unsaturated group, a photopolymerization initiator and a thermal curing agent, wherein the thermal curing agent is a polycarbodiimide compound having a carbodiimide group, the carbodiimide group in the polycarbodiimide compound is protected by an amino group that can be dissociated at a temperature equal to or higher than 80° C. and the polycarbodiimide compound has a weight average molecular weight of 400 to 5000 and a carbodiimide equivalent of 180 to 2500.

12 Claims, No Drawings

(56) References Cited

U.S. PATENT DOCUMENTS

| | | | | |
|---|---|---|---|---|
| 2016/0037034 A1* | 2/2016 | Inasaki | ............ | C07F 9/304 546/10 |
| 2016/0122292 A1* | 5/2016 | Sakai | ............ | C07C 65/28 549/392 |
| 2017/0334837 A1 | 11/2017 | Komori et al. | | |
| 2018/0094095 A1 | 4/2018 | Takahashi et al. | | |

FOREIGN PATENT DOCUMENTS

| | | |
|---|---|---|
| CN | 102736415 | 10/2012 |
| EP | 0957122 | 11/1999 |
| JP | H11-80294 A | 3/1999 |
| JP | 2004-287267 A | 10/2004 |
| JP | 2005-232438 A | 9/2005 |
| JP | 2006-96962 A | 4/2006 |
| JP | 2009-198966 | 9/2009 |
| JP | 2009-235278 A | 10/2009 |
| JP | 2013-80050 A | 5/2013 |
| JP | 2016-149388 A | 8/2016 |
| TW | 201638154 | 11/2016 |
| WO | 2012/029468 A1 | 3/2012 |
| WO | 2016/163285 A1 | 10/2016 |

OTHER PUBLICATIONS

International Search Report for corresponding international application PCT/JP2017/016112 dated Aug. 1, 2017.

Office Action issued for the Taiwanese Patent Application No. 106124901, dated Oct. 30, 2020, 7 pages including English translation.

Office Action issued for the Korean Patent Application No. 10-2019-7013914, dated Aug. 17, 2021, 6 pages including machine translation.

Office Action issued for Chinese Patent Application No. 201780070479. 8, dated May 5, 2022, 13 pages including machine translation.

* cited by examiner

PHOTOSENSITIVE RESIN COMPOSITION, SOLDER RESIST FILM USING SAID PHOTOSENSITIVE RESIN COMPOSITION, FLEXIBLE PRINTED WIRING BOARD, AND IMAGE DISPLAY DEVICE

CROSS REFERENCE TO RELATED APPLICATION

This application claims the priority of Japanese Patent Application No. 2016-225507, filed on Nov. 18 2016, in the JPO (Japanese Patent Office). Further, this application is the National Phase Application of International Application No. PCT/JP2017/016112, filed on Apr. 21, 2017, which designates the United States and was published in Japan. Both of the priority documents are hereby incorporated by reference in their entireties.

TECHNICAL FIELD

The present invention relates to a photosensitive resin composition, and more particularly, to a photosensitive resin composition used in a dry film resist used for a flexible printed circuit, a solder resist film using the photosensitive resin composition, a flexible printed circuit, and an image display device including the flexible printed circuit.

BACKGROUND ART

Flexible printed circuits (FPC) have advantages such as flexibility and bendability and are widely used in various electronic equipment such as mobile phones, video cameras, and notebook computers in which miniaturization, weight lightening, and thickness reduction progress rapidly, in order to incorporate circuits into complicated mechanisms.

The FPC is composed of a copper-clad laminate (CCL) and a cover coat material forming a circuit by an etching process. The cover coat material is generally selected from a cover lay (CL) film, a photosensitive ink, a photosensitive film (photosensitive cover lay film), and the like. In particular, when used as a surface protective material for the FPC, the cover lay film obtained by coating an adhesive to a molded body (support body) such as a polyimide film is frequently used for ease of handling, durability, and high insulation reliability. In the following description, the FPC is mainly described, but can also be used for semiconductor package applications (semiconductor PKG applications).

When the cover lay film is used in the FPC, an opening portion is provided on the cover lay film in accordance with a portion corresponding to a terminal portion of a CCL circuit, and the opening is aligned with the corresponding terminal portion, and then a thermocompression method by hot pressing or the like is common. However, since it is difficult to provide an opening portion on a thin cover lay film and alignment at the time of bonding is frequently performed manually, positional accuracy is poor, and workability of bonding is also poor.

On the other hand, a solder resist or the like may be used as the surface protective material for the FPC, and in particular, a solder resist having a photosensitive function is preferably used when fine processing is required. The solder resist used for manufacturing the FPC includes a type in which a liquid solder resist ink of an ultraviolet curing type, a thermosetting type, or combination of the ultraviolet curing type and the thermosetting type is coated on a printed circuit by a printing method such as screen printing, a type in which a dry film resist formed on a support such as a polyester film is stuck to the printed circuit and the support is peeled off after ultraviolet irradiation to obtain a membrane, and the like.

The liquid solder resist generally includes a two-liquid type photosensitive resin composition separately dividing a thermosetting epoxy resin and a photosensitive prepolymer containing a carboxylic acid group for imparting alkali development properties are separated separately. In the two-liquid type photosensitive resin composition, since a reaction between the epoxy resin and the carboxylic acid group of the photosensitive prepolymer proceeds even at room temperature, storage stability after mixing the two liquids is short from several hours to one day, and storage in a film state is difficult. Therefore, use conditions are limited, such as mixing just before use.

The dry film resist is desirable to have advantages that uniformity of film thickness, surface smoothness, thin film formability, handleability, and the like are good and a step for forming the resist can be simplified. Various studies have been made on the storage stability of the dry film resist in a film state. There has been proposed a photosensitive film for a permanent resist including a photosensitive resin composition layer composed of a photosensitive resin composition containing, for example, (A) a polymer having a carboxyl group, (B) a photopolymerizable compound having an ethylenically unsaturated bond, (C) a photopolymerization initiator, and (D) a bismaleimide compound as a curing agent that crosslinks itself by heating (see, for example, Patent Document 1).

On the other hand, as a thickness of electrical equipment is reduced in recent years, component accommodation space inside a case tends to be limited. The thickness of the electronic equipment including a liquid crystal display unit is generally reduced by ranging a glass substrate of a flat panel display such as a liquid crystal display, a plasma display, and an organic EL display, and a printed substrate on which an integrated circuit as a driving circuit and an electronic component are mounted so that substrate surfaces face each other. The FPC is used for electrically connecting the glass substrate and the printed circuit board and is connected to the glass substrate and the printed circuit board in a folded state in the case (see, for example, Non-Patent Document 1). When the FPC is mounted in a bending state, a failure such as separation from an adhesive component may occur when a rebound of the FPC is strong, and there is an increasing demand for low rebound properties at a bending portion of the FPC when the FPC is mounted.

There has been proposed a photosensitive resin composition containing, for example, (A) a polyurethane compound having an ethylenically unsaturated group and a carboxyl group, (B) a polymerizable compound having an ethylenically unsaturated bond, (C) a photopolymerization initiator, (D) a phosphorus-containing compound, and (E) a thermal curing agent as a technique of improving flexibility of the solder resist, warpage during component mounting, and the low rebound properties (see, for example, Patent Document 2).

CITATION LIST

Patent Documents

Patent Document 1: JP-A-2004-287267
Patent Document 2: JP-A-2013-80050

Non-Patent Documents

Non-Patent Document 1: Yasushi Goto, "Anisotropic Conductive Film", Hitachi Review, Vol. 89, No. 5 436-437, p. 52-57

SUMMARY OF INVENTION

Technical Problem

However, even in the related art, achievement of the low rebound properties is still not sufficient, and there is an increasing further demand. Specifically, there is a demand for an FPC capable of realizing excellent low rebound properties that can maintain a shape at the time of bending as it is.

Also, in the dry film resist used as the surface protective material for the FPC, a dry film resist having more durable storage stability after film formation and excellent low rebound properties is desired.

Therefore, a problem of the present invention is to provide a photosensitive resin composition used for forming a solder resist layer, particularly to a photosensitive resin composition that can obtain a dry resist film excellent in low rebound properties and storage stability, a solder resist film using the photosensitive resin composition, a flexible printed circuit, and an image display device including the flexible printed circuit.

Solution to Problem

As a result of repeating intensive studies to solve the problem, the present inventors have found that the above problem can be solved by protecting a carbodiimide group in the polycarbodiimide compound with an amino group capable of being dissociated at a predetermined temperature to complete the present invention.

That is, the present invention includes the following <1> to <12>.

<1> A photosensitive resin composition containing: a photosensitive prepolymer having a carboxyl group and an ethylenically unsaturated group; a photopolymerization initiator; and a thermal curing agent, wherein the thermal curing agent is a polycarbodiimide compound having a carbodiimide group, the carbodiimide group is protected by an amino group dissociated at a temperature of 80° C. or higher in the polycarbodiimide compound, and the polycarbodiimide compound has a weight average molecular weight of 400 to 5,000 and a carbodiimide equivalent of 180 to 2,500.

<2> The photosensitive resin composition according to the above <1>, wherein the polycarbodiimide compound is represented by the following formula (1).

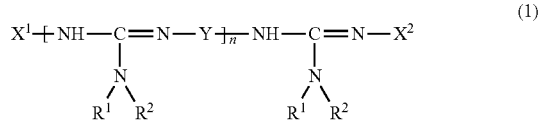

In the formula (1), $R^1$ and $R^2$ are each independently a hydrogen atom, a linear or branched alkyl group having 1 to 6 carbon atoms, or a cycloalkyl group having 3 to 6 carbon atoms, $R^1$ and $R^2$ may be the same as or different from each other, but are not hydrogen atoms at the same time, $X^1$ and $X^2$ each represent —$R^3$—NH—COOR$^4$, $R^3$ is a divalent organic group having at least one aromatic group, $R^4$ is a residue obtained by removing a hydroxy group from an organic group having the hydroxy group, $X^1$ and $X^2$ may be the same as or different from each other, Y represents —$R^5$—NHCOO—$R^6$—OCOHN—$R^5$—, $R^5$ are each independently a divalent organic group having at least one aromatic group, $R^6$ is a divalent organic group, and n represents an integer of 1 to 3.

<3> The photosensitive resin composition according to the above <2>, wherein, in the formula (1), $R^1$ and $R^2$ are each independently a linear or branched alkyl group having 1 to 6 carbon atoms or a cycloalkyl group having 3 to 6 carbon atoms.

<4> The photosensitive resin composition according to any one of the above <1> to <3>, wherein the carbodiimide equivalent of the polycarbodiimide compound is 200 to 2,500.

<5> The photosensitive resin composition according to any one of the above <1> to <4>, wherein the carbodiimide equivalent of the polycarbodiimide compound is 0.5 to 1.5 equivalents with respect to the carboxyl group of the photosensitive prepolymer.

<6> The photosensitive resin composition according to any one of the above <1> to <5>, further containing a colorant.

<7> The photosensitive resin composition according to any one of the above <1> to <6>, having a tensile elastic modulus at 23° C. after thermal curing is 2 GPa or less.

<8> The photosensitive resin composition according to any one of the above <1> to <7>, wherein the photosensitive resin composition is used in a solder resist film.

<9> A solder resist film formed using the photosensitive resin composition according to any one of the above <1> to <8>.

<10> The solder resist film according to the above <9>, wherein when a test piece of a flexible printed circuit board having a width of 10 mm and a length of 100 mm, in which the solder resist film having a thickness of 25 μm is laminated on both sides of a flexible copper-clad laminate in which circuit patterns each having a copper thickness of 18 μm are provided on both sides of polyimide having a thickness of 25 μm, is subjected to a repulsion resistant test in which the test piece is bent 180°, a load of 1000 g is applied on the test piece for 10 seconds, and the test piece is left to stand at 23° C. for 1 hour after the road is released, a rebound angle of the test piece is 20° or less when the rebound angle in a bent state is defined as 0°.

<11> A flexible printed circuit containing the solder resist film according to the above <9> or <10>.

<12> An image display device including: a liquid crystal display substrate having a liquid crystal display unit on a surface thereof; a printed circuit board provided with a drive circuit of the liquid crystal display substrate; and a flexible printed circuit for electrically connecting the liquid crystal display substrate with the printed circuit board, wherein the printed circuit board is disposed on a back side of the liquid crystal display substrate, the flexible printed circuit is according to the above <11> and is disposed in a state of being plastically deformed into a U shape, and one end thereof is connected to the printed circuit board and the other end thereof is connected to the liquid crystal display substrate.

Advantageous Effects of Invention

According to the photosensitive resin composition of the present invention, since the carbodiimide group in the polycarbodiimide compound is protected by an amino group, it does not react with the photosensitive prepolymer in the composition. As a result, even after a heating process at a temperature of less than 80° C. to form a film, the carbodiimide can be suppressed from reaction and stored in a film state at room temperature for two weeks or more. That is, even after elapse of time after forming the film, development is possible. Further, since the polycarbodiimide compound as the thermal curing agent used in the present invention has a structure in which the carbodiimide is flexible and high heat resistance, it is possible to impart flexibility to a cured product after heat curing.

Further, since the amino group in the polycarbodiimide compound is separated from the carbodiimide group at a temperature of 80° C. or higher, the photosensitive resin composition of the present invention can easily form the solder resist film on a circuit by sequentially performing photocuring (for example, ultraviolet curing) and thermal curing.

In addition, the polycarbodiimide compound used in the present invention has excellent flexibility, and it is possible to impart excellent flexibility to the cured product after the photosensitive resin composition is cured. Therefore, the flexible printed circuit including the solder resist film obtained by using the photosensitive resin composition of the present invention has little rebound after being bent, and excellent low rebound properties that a shape when the flexible printed circuit is bent can be maintained nearly as it is.

Therefore, the flexible printed including the solder resist film obtained by using the photosensitive resin composition of the present invention can be suitably used as an electronic material component used in electronic equipment required to be reduced in size and thickness. In particular, when the flexible printed circuit of the present invention arranges a glass substrate of a flat panel display and the printed circuit board including the drive circuit in a case reduced in thickness so that substrate surfaces thereof face each other, the flexible printed circuit can be bent into, for example, a U shape and incorporated, and can adhere to the glass substrate and the printed circuit board. For example, in the liquid crystal display, since the flexible printed circuit of the present invention has excellent low rebound properties, no stress is applied to the liquid crystal display unit of the glass substrate, and even if a stress is applied from the outside of the case, no display spot is generated on the liquid crystal display unit. Further, since the flexible printed circuit is not repelled even when the flexible printed circuit is bended and incorporated into the case, no stress is applied to an adhesive portion, and no failure such as separation from the adhesive component such as the glass substrate and the printed circuit board occurs.

DESCRIPTION OF EMBODIMENTS

Although embodiment of the present invention will be described in detail, the present invention is not limited to the following embodiments, and various modifications can be implemented within a scope of the gist of the present invention.

In the present invention, (meth)acrylic acid means acrylic acid or methacrylic acid, and the same applies to (meth) acrylate.

Also, in the present specification, all percentages and parts represented by mass are the same as percentages and parts represented by weight.

A photosensitive resin composition of the present invention contains: a photosensitive prepolymer having a carboxyl group and an ethylenically unsaturated group; a photopolymerization initiator; and a thermal curing agent, wherein the thermal curing agent is a polycarbodiimide compound having a carbodiimide group, the carbodiimide group is protected by an amino group dissociated at a temperature of 80° C. or higher in the polycarbodiimide compound, and the polycarbodiimide compound has a weight average molecular weight of 400 to 5,000 and a carbodiimide equivalent of 180 to 2,500.

Hereinafter, each component will be described.

(Photosensitive Prepolymer)

As the photosensitive prepolymer in the present embodiment, a prepolymer having an ethylenically unsaturated end group derived from an acrylic monomer is preferably used. The acrylic monomer referred herein is an acrylic acid or a methacrylic acid, or a derivative such as an alkyl ester and a hydroxyalkyl ester thereof.

Examples of the photosensitive prepolymer include polyester acrylate, epoxy acrylate, urethane acrylate, acrylic acrylate, polybutadiene acrylate, silicone acrylate, and melamine acrylate. Among them, epoxy acrylate and urethane acrylate are preferable in terms of excellent balance of flexibility, heat resistance, and adhesiveness.

The photosensitive prepolymer of the present embodiment is not particularly limited unless it satisfies the above conditions, but a prepolymer having both a carboxyl group and at least two ethylenically unsaturated groups in one molecule is used. Specifically, an epoxy (meth)acrylate compound (EA) having a carboxyl group or a urethane (meth)acrylate compound (UA) having a carboxyl group is particularly preferable.

<Epoxy (Meth)Acrylate Compound (EA) Having Carboxyl Group>

The epoxy (meth)acrylate compound having a carboxyl group in the present embodiment is not particularly limited, but an epoxy (meth)acrylate compound obtained by reacting a reactant of an epoxy compound and an unsaturated group-containing monocarboxylic acid with an acid anhydride is suitable.

Examples of the epoxy compound include, but are not limited to, epoxy compounds such as a bisphenol A type epoxy compound, a bisphenol F type epoxy compound, a bisphenol S type epoxy compound, a phenol novolac type epoxy compound, a biphenyl type epoxy compound, a cresol novolac type epoxy compound, and an aliphatic epoxy compound. These can be used in one kind alone or in combination of two or more kinds. Among them, the bisphenol F type epoxy compound is preferably used in view of flexibility, and a biphenyl type epoxy compound is preferably used in view of insulation properties.

Examples of the unsaturated group-containing monocarboxylic acid include acrylic acid, dimer of acrylic acid, methacrylic acid, β-furfuryl acrylic acid, β-styryl acrylic acid, cinnamic acid, crotonic acid, and α-cyanocinnamic acid. Examples thereof also include a half-ester compound which is a reaction product of a hydroxy group-containing acrylate and a saturated or unsaturated dibasic acid anhydride, and a half-ester compound which is a reaction product of an unsaturated group-containing monoglycidyl ether and a saturated or unsaturated dibasic acid anhydride. These unsaturated group-containing monocarboxylic acids can be used in one kind alone or in combination of two or more kinds.

Examples of the acid anhydride include dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endo-methylene-tetrahydrophthalic anhydride, methyl endo-methylene-tetrahydrophthalic anhydride, chlorendic anhydride, and methyltetrahydrophthalic anhydride, aromatic polyvalent carboxylic acid anhydrides such as trimellitic anhydride, pyromellitic anhydride, and benzophenone tetracarboxylic dianhydride, and polyvalent carboxylic acid anhydride derivatives such as 5-(2,5-dioxotetrahydrofuryl)-3-methyl-3-cyclohexene-1,2-dicarboxylic anhydride and end bicyclo-[2,2,1]-hept-5-ene-2,3-dicarboxylic acid anhydride. These can be used in one kind alone or in combination of two or more kinds.

A molecular weight of the epoxy (meth)acrylate compound having a carboxyl group obtained in this manner is not particularly limited, but a weight average molecular weight is preferably 5,000 to 15,000, and more preferably 8,000 to 12,000. Here, the weight average molecular weight is a polystyrene equivalent value measured by gel permeation chromatography.

The acid value (solid content acid value) of the epoxy (meth)acrylate compound is preferably in a range of 30 to 150 mg KOH/g, and more preferably in a range of 40 to 100 mg KOH/g in view of balance of developability and flexibility after curing. The solid content acid value is a value measured in accordance with JIS K0070.

The epoxy (meth)acrylate compound having the carboxyl group may constitute a photosensitive prepolymer (A) alone or in combination with a urethane (meth)acrylate compound having a carboxyl group to be described below. In this case, the epoxy (meth)acrylate compound having a carboxyl group is preferably used in a range of 100 parts by mass or less with respect to 100 parts by mass of the urethane (meth)acrylate compound having a carboxyl group.

<Urethane (Meth)Acrylate Compound (UA) Having Carboxyl Group>

The urethane (meth)acrylate compound having a carboxyl group in the present embodiment is a compound containing a unit derived from (meth)acrylate having a hydroxy group, a unit derived from a polyol, and a unit derived from polyisocyanate as constituent units. More specifically, each end is composed of a unit derived from (meth)acrylate having a hydroxy group, and units between the two ends are composed of repeating units in which a unit derived from polyol and a unit derived from polyisocyanate is connected by urethane bond, and a carboxyl group is present in the repeating unit.

That is, the urethane (meth)acrylate compound having the carboxyl group is represented by the following formula.

[In the formula, n is an integer of 1 to 200, $OR^{11}O$ represents a dehydrogenated residue of a polyol, and $R^{12}$ represents a deisocyanate residue of a polyisocyanate.]

The urethane (meth)acrylate compound having a carboxyl group can be produced by reacting at least a (meth)acrylate having a hydroxy group, a polyol, and a polyisocyanate, and it is necessary here to use a compound having a carboxyl group in at least one of the polyol or the polyisocyanate. Preferably, a polyol having a carboxyl group is used. As described above, by using a compound having a carboxyl group as the polyol and/or polyisocyanate, the urethane (meth)acrylate compound in which a carboxyl group is present in $R^{11}$ or $R^{12}$ can be manufactured. In the above formula, n is preferably about 1 to 200, and more preferably 2 to 30. When n is in such a range, a cured film composed of the photosensitive resin composition has more excellent flexibility.

In addition, in a case where at least one of the polyol and the polyisocyanate is used in two or more kinds, the repeating unit represents a plurality of kinds, and regularity of the plurality of units can be appropriately selected depending on the purpose, such as complete randomness, block, and localization.

Examples of the (meth)acrylate having a hydroxy group used in the present embodiment include ethanediol monoacrylate, propanediol monoacrylate, 1,3-propanediol monoacrylate, 1,4-butanediol monoacrylate, 1,6-hexanediol monoacrylate, 1,9-nonanediol monoacrylate, diethylene glycol monoacrylate, triethylene glycol monoacrylate, dipropylene glycol monoacrylate, 2,3-dihydroxypropyl acrylate, 3-(4-benzoyl-3-hydroxyphenoxy)-2-hydroxypropyl methacrylate, 2,3-dihydroxypropyl 2-methacrylate, 2-hydroxyethyl (meth) acrylate, hydroxypropyl (meth)acrylate, hydroxybutyl (meth)acrylate, and caprolactone or alkylene oxide adducts of the (meth)acrylates, glycerin mono(meth)acrylate, glyceride di(meth)acrylate, glycidyl methacrylate-acrylic acid adducts, trimethylolpropane mono(meth)acrylate, trimethylol di(meth)acrylate, pentaerythritol tri(meth)acrylate, dipentaerythritol penta(meth)acrylate, ditrimethylolpropane tri(meth)acrylate, and trimethylol propane-alkylene oxide adduct-di(meth)acrylate.

These (meth)acrylates having a hydroxy group can be used in one kind alone or in combination of two or more kinds.

As the polyol used in the present embodiment, a polymer polyol and/or a dihydroxy compound can be used. Examples of the polymer polyol include polyether-based diols such as polyethylene glycol, polypropylene glycol, and polytetramethylene glycol, polyester-based polyols obtained from esters of polyhydric alcohols and polybasic acids, polycarbonate-based diols containing units derived from pentamethylene carbonate and the like as constituent units, and polylactone-based diols such as polycaprolactone diol and polybutyrolactone diol.

When the polymer polyol having a carboxyl group is used, it is possible to use, for example, a compound synthesized such that trivalent or higher polybasic acids such as (anhydrous) trimellitic acid coexist during synthesis of the polymer polyol, and the carboxyl group remains.

These polymer polyols can be used in one kind alone or in combination of two or more kinds. It is preferable to use a polymer polyol having a weight average molecular weight of 200 to 2,000 since the cured film composed of the photosensitive resin composition is more flexible. Among these polymer polyols, it is preferable to use the polycarbonate diol since the cured film composed of the photosensitive resin composition has high heat resistance and excellent pressure cooker resistance. Further, constituent units of the polymer polyols are not only from a single constituent unit but also from a plurality of constituent units, which is more preferable since the cured film composed of the photosensitive resin composition has further excellent flexibility. Examples of the polymer polyol composed of a plurality of such constituent units include a polyether-based diol containing units derived from ethylene glycol and propylene glycol as constituent units, and a polycarbonate diol containing units derived from hexamethylene carbonate and pentamethylene carbonate as constituent units.

As the dihydroxy compound, a branched or linear compound having two alcoholic hydroxyl groups can be used, but a dihydroxy aliphatic carboxylic acid having a carboxyl group is particularly preferably used. Examples of such a dihydroxy compound include dimethylol propionic acid and dimethylol butanoic acid. By using the dihydroxy aliphatic carboxylic acid having a carboxyl group, a carboxyl group can be easily present in the urethane (meth)acrylate compound.

The dihydroxy compound can be used in one kind alone or in combination of two or more kinds, and may be used together with the polymer polyol.

When the polymer polyol having a carboxyl group is used in combination or the polymer polyol having a carboxyl group is used as polyisocyanate to be described later, dihydroxy compounds having no carboxyl group such as ethylene glycol, diethylene glycol, propylene glycol, 1,4-butanediol, 1,3-butanediol, 1,5-pentanediol, neopentyl glycol, 3-methyl-1,5-pentanediol, 1,6-hexanediol, 1,4-cyclohexane dimethanol, and hydroquinone may be used.

Specific examples of the polyisocyanate used in the present embodiment include 2,4-toluene diisocyanate, 2,6-toluene diisocyanate, isophorone diisocyanate, hexamethylene diisocyanate, diphenylmethylene diisocyanate, (o, m or p)-xylene diisocyanate, methylene bis(cyclohexyl isocyanate), trimethyl hexamethylene diisocyanate, cyclohexane-1,3-dimethylene diisocyanate, cyclohexane-1,4-dimethylene diisocyanate, and 1,5-naphthalene diisocyanate. These polyisocyanates may be used in one kind alone or in combination of two or more kinds. Further, polyisocyanate having a carboxyl group can also be used.

A molecular weight of the urethane (meth)acrylate compound having a carboxyl group used in the present embodiment is not particularly limited, but a weight average molecular weight (Mw) is preferably 1,000 to 30,000, and more preferably 8,000 to 20,000. When the weight average molecular weight of the urethane (meth)acrylate compound having a carboxyl group is less than 1,000, elasticity and strength of the cured film composed of the photosensitive resin composition may be impaired; and when the weight average molecular weight is more than 30,000, the cured film may become hard and the flexibility may be reduced.

An acid value of the urethane (meth)acrylate is preferably 30 to 80 mg KOH/g, and more preferably 40 to 60 mg KOH/g. When the acid value is less than 30 mg KOH/g, alkali solubility of the photosensitive resin composition may deteriorate, and when the acid value is more than 80 mg KOHWg, flexibility and the like of the cured film may deteriorate.

The acid value of the urethane (meth)acrylate compound having a carboxyl group is preferably 30 to 80 mg KOH/g. Within that range, flexibility tends to decrease although developability tends to improve as the acid value increases. Within that range, the flexibility tends to increase and the developability tends to be lowered, and development remnants tend to easily occur as the acid value decreases. In this case, at least two kinds of the urethane (meth)acrylate compound having a carboxyl group with different acid values are used in combination, so that the photosensitive resin composition having excellent flexibility and good developability sometimes can be easily obtained.

The urethane (meth)acrylate compound having a carboxyl group can be manufactured by: (1) a method of collectively mixing and reacting (meth)acrylate having a hydroxy group, a polyol and a polyisocyanate; (2) a method of reacting a polyol with polyisocyanate to manufacture a urethane isocyanate prepolymer containing one or more isocyanate groups per molecule, and then reacting the urethane isocyanate prepolymer with (meth)acrylate having a hydroxy group; and (3) a method of reacting polyisocyanate with (meth)acrylate having a hydroxy group to manufacture a urethane isocyanate prepolymer containing one or more isocyanate groups per molecule, and then reacting the prepolymer with a polyol.

(Photopolymerization Initiator)

A photopolymerization initiator is not particularly limited, and any of conventionally known photopolymerization initiators can be used. Specific examples thereof include bis (2,4,6-trimethylbenzoyl)-phenylphosphine oxide, 2,4,6-trimethylbenzoyl diphenylphosphine oxide, 1,2-octanedione, 1-[4-(phenylthio)phenyl-,2-(O-benzoyloxime)], ethanone, 1-[9-ethyl-6-(2-methylbenzoyl)-9H-carbazol-3-yl]-, 1-(O-acetyl oxime), 2-benzyl-2-dimethylamino-1-(4-morpholinophenyl)-butanone-1,2-(dimethylamino)-2-[(4-methylphenyl) methyl]-1-[4-(4-morpholinyl) phenyl]-1-butanone, benzoin, benzoin methyl ether, benzoin ethyl ether, benzoin isopropyl ether, benzoin-n-butyl ether, benzoin isobutyl ether, acetophenone, dimethylaminoacetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexyl phenyl ketone, 2-methyl-1-[4-(methylthio) phenyl]-2-morpholinopropan-1-one, 4-(2-hydroxyethoxy) phenyl-2-(hydroxy-2-propyl) ketone, benzophenone, p-phenyl benzophenone, 4,4'-diethylamino benzophenone, dichlorobenzophenone, 2-methylanthraquinone, 2-ethylanthraquinone, 2-tertiary butyl anthraquinone, 2-aminoanthraquinone, 2-methyl thioxanthone, 2-ethyl thioxanthone, 2-chloro thioxanthone, 2,4-dimethyl thioxanthone, 2,4-diethyl thioxanthone, benzyl dimethyl ketal, acetophenone dimethyl ketal, and p-dimethylamino benzoic acid ethyl ester as representative photopolymerization initiators. These can be used in one kind alone or in combination of two or more kinds.

Among these, bis(2,4,6 trimethylbenzoyl)-phenylphosphine oxide, 2,4,6-trimethylbenzoyl diphenylphosphine oxide, 2-benzyl-2-dimethylamino-1-(4-morpholinophenyl)-butanone-1,2-(dimethylamino)-2-[(4-methylphenyl) methyl]-1-[4-(4-morpholinyl) phenyl]-1-butanone, and thioxanthone are preferably used in view of thick film curability.

An amount of the photopolymerization initiator used is preferably 1 to 20 parts by mass, and more preferably 2 to 14 parts by mass with respect to 100 parts by mass of the photosensitive prepolymer. When a content of the photopolymerization initiator is less than 1 part by mass with respect to 100 parts by mass of the photosensitive prepolymer, a photo curing reaction of the photosensitive prepolymer is difficult to proceed, and when the content is more than 20 parts by mass, curing is not improved for a percentage of the amount added, embrittlement of the cured film occurs, and adhesion properties may not appear.

(Thermal Curing Agent)

A thermal curing agent used in the present embodiment is a polycarbodiimide compound containing a carbodiimide group capable of reacting with the carboxyl group of the photosensitive prepolymer. The polycarbodiimide compound of the present invention is characterized in that the carbodiimide group in a structure thereof is protected by an amino group which is dissociated at a temperature of 80° C. or higher. "Protected" means that the carbodiimide group and the amino group are covalently bonded to each other to an extent that the amino group is dissociated by heat.

Since the carbodiimide group (—N=C=O) is highly reactive with the carboxyl group and a reaction starts at the moment when the polycarbodiimide compound is mixed with the photosensitive prepolymer having a carboxyl group, the composition is inferior in preservation stability, and is not suitable for a dry resist film to be formed at a temperature of less than 80° C., and no polycarbodiimide is used in the conventional photosensitive resin composition. That is, since the polycarbodiimide cannot be present in the photosensitive resin composition as it is, a carbodiimide compound in which a carbodiimide group is protected with an amino group is used in the present invention.

More specifically, since the film is formed by heating at a temperature of less than 80° C. and similarly subjected to a thermocompression treatment such as a thermal lamination treatment at a temperature of less than 80° C., it is considered that the amino group is not dissociated from the carbodiimide group, and development can be performed precisely even at this time. Further, since the photosensitive resin composition of the present invention has moderate fluidity during the thermocompression treatment, it is possible to suitably embed a pattern circuit of the FPC. Thereafter, a developing treatment is performed to form an opening portion at a predetermined position. Thereafter, the amino group is heated at a temperature of 80° C. or higher, so that the amino group is dissociated, and the carbodiimide group reacts with the carboxyl group to completely cure the photosensitive resin composition (C stage).

The amino group is not particularly limited unless it can be dissociated from the carbodiimide group at a temperature of 80° C. or higher, and any one of the primary to the tertiary can be used. Among them, in view of improving stability after bonding with the carbodiimide group, a primary amino group and a secondary amino group having active hydrogen are preferably used. By using an amino group having active hydrogen, a bonding force with the carbodiimide group increases.

The polycarbodiimide compound of the present embodiment is preferably a compound represented by the following formula (1).

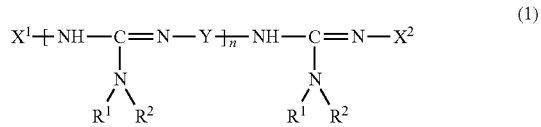

(In the formula (1), $R^1$ and $R^2$ are each independently a hydrogen atom, a linear or branched alkyl group having 1 to 6 carbon atoms, or a cycloalkyl group having 3 to 6 carbon atoms, $R^1$ and $R^2$ may be the same as or different from each other, but are not hydrogen atoms at the same time, $X^1$ and $X^2$ each represent —$R^3$—NH—COOR$^4$, $R^3$ is a divalent organic group having at least one aromatic group, $R^4$ is a residue obtained by removing a hydroxy group from an organic group having the hydroxy group, $X^1$ and $X^2$ may be the same as or different from each other, Y represents —$R^5$—NHCOO—$R^6$—OCOHN—$R^5$—, $R^5$ are each independently a divalent organic group having at least one aromatic group, $R^6$ is a divalent organic group, and n represents an integer of 1 to 3.)

In the formula (1), $R^1$ and $R^2$ are each independently a hydrogen atom, a linear or branched alkyl group having 1 to 6 carbon atoms, or a cycloalkyl group having 3 to 6 carbon atoms. $R^1$ and $R^2$ linked to the same nitrogen atom may be the same as or different from each other, but neither $R^1$ nor $R^2$ is a hydrogen atom.

Examples of the linear or branched alkyl group having 1 to 6 carbon atoms include a methyl group, an ethyl group, a propyl group, an isopropyl group, an n-butyl group, a sec-butyl group, an isobutyl group, a tert-butyl group, a pentyl group, and a hexyl group; examples of the cycloalkyl group having 3 to 6 carbon atoms include a cyclopropyl group, a cyclobutyl group, a cyclopentyl group, and a cyclohexyl group.

When the amino group of the polycarbodiimide compound is a primary amine having two active hydrogens, the amino group reacts with other carbodiimide groups and the polycarbodiimide forms a three-dimensional network structure, resulting in gelation. As a result, compatibility with other components contained in the photosensitive resin composition may decrease. Therefore, a secondary amino group having one active hydrogen is preferably used. Specifically, it is more preferable that $R^1$ and $R^2$ are each independently a linear or branched alkyl group having 1 to 6 carbon atoms, or a cycloalkyl group having 3 to 6 carbon atoms, still more preferably an ethyl group, a methyl group, a propyl group, and an isopropyl group. Among these, both $R^1$ and $R^2$ are particularly preferably a propyl group or an isopropyl group, and most preferably an isopropyl group.

In the present embodiment, the carbodiimide group of the polycarbodiimide is a structure protected with an amine group, and as described above, the protecting amine is preferably a secondary amine that hardly causes a crosslinking reaction in view of compatibility with other components. Examples of the secondary amine include dimethylamine, N-ethylmethylamine, N-ethylpropylamine, N-methylbutylamine, N-methylpentylamine, N-hexylamine, N-methylcyclohexylamine, diethylamine, N-ethylpropylamine, N-ethylbutylamine, N-ethylpentylamine, N-ethylhexylamine, diisopropylamine, N-propylbutylamine, N-propylpentylamine, N-propylhexylamine, di-sec-butylamine, di-n-butylamine, and diisobutylamine.

As the amine used in the present embodiment, an amine having a boiling point of 160° C. or lower can be suitably used. By protecting the carbodiimide group with the amine having a boiling point of 160° C. or lower, a reaction with the carboxyl group at room temperature can be suppressed and dissociated in a temperature range of 80° C. to 200° C. The amine to be used has more preferably a boiling point of 50° C. to 140° C., and still more preferably a boiling point of 80° C. to 110° C. When the boiling point is 80° C. to 110° C., the amine can be dissociated by a heat treatment of 100° C. to 160° C.

In Formula (1), $X^1$ and $X^2$ each represent —$R^3$—NH—COOR$^4$. Here, $R^3$ is a divalent organic group having at least one aromatic group, and $R^4$ is a residue obtained by removing a hydroxy group from an organic group having the hydroxy group, and $X^1$ and $X^2$ may be the same as or different from each other.

Examples of the divalent organic group having at least one aromatic group of $R^3$ include a divalent residue of an aromatic diisocyanate having at least one aromatic group. Examples of the aromatic diisocyanate include 4,4'-diphenylmethane diisocyanate, 4,4'-diphenyl ether diisocyanate, p-phenylene diisocyanate, m-phenylene diisocyanate, 3,3'-dimethoxy-4,4'-biphenyl diisocyanate, o-tolidine diisocyanate, naphthylene diisocyanate, 2,4-tolylene diisocyanate, 2,6-tolylene diisocyanate, 3,3'-dimethoxy-4,4'-diphenylmethane diisocyanate, and 3,3'-dimethyl-4,4'-diphenyl ether diisocyanate. These may be used in one kind alone or in combination of two or more kinds.

Among these, in view of high versatility of industrial raw materials, divalent residues of 4,4'-diphenylmethane diisocyanate, 2,4-tolylene diisocyanate, and 2,6-tolylene diisocyanate are preferable.

The residue obtained by removing a hydroxy group from an organic group having one hydroxy group of $R^4$ is not particularly limited unless it is a residue of an organic group which does not inhibit the hydroxy group of the organic group from reacting with an isocyanate group and has no reactivity with the isocyanate group other than the hydroxy group. Examples of the organic group having no reactivity with the isocyanate group other than the hydroxy group include hydroxyalkyl groups such as a hydroxymethyl group, a hydroxyethyl group, a hydroxypropyl group, and a hydroxybutyl group, a hydroxyester group, a hydroxyether group, and a hydroxyalkylene oxide group. Specifically, when the organic group having one hydroxy group is a hydroxymethyl group, the residue excluding the hydroxy group is a methyl group; when the organic group is a hydroxyethyl group, the residue excluding the hydroxy group is an ethyl group.

In the present embodiment, $R^4$ is preferably a residue obtained by removing a hydroxy group from a hydroxyalkyl group, and more preferably a methyl group or an ethyl group.

In Formula (1), Y is —$R^5$—NHCOO—$R^6$—OCOHN—$R^5$—. Here, $R^5$ are each independently a divalent organic group having at least one aromatic group, and $R^6$ is a divalent organic group.

Examples of the divalent organic group having at least one aromatic group of $R^5$ include a divalent residue of an aromatic diisocyanate having at least one aromatic group same as $R^3$ described above, and specific examples and preferable examples thereof are also the same.

Examples of a divalent organic group of $R^6$ include an ester bond, an ether bond, a carbonate group, and a conjugated diene structure. Specific examples thereof include a divalent residue of a diol compound. Examples of the diol compound include a low molecular or polyalkylene diol, a polycarbonate diol, a polyether diol, a castor oil-based diol, and a polyester diol.

The low molecular or polyalkylene diol is a compound having two hydroxy groups in one molecule, and examples thereof include ethylene glycol, diethylene glycol, 1,2-propanediol, 1,3-propanediol, 2-methyl-1,3-propane diol, 2,2-dimethyl-1,3-propanediol, 2,2-diethyl-1,3-propanediol, 2-butyl-2-ethyl-1,3-propanediol, 2-bentyl-2-propyl-1,3-propanediol, 1,2-butanediol, 1,3-butanediol, 1,4-butanediol, 1,5-pentanediol, 1,5-hexanediol, 1,6-hexanediol, 3-methyl-1,5-pentanediol, 2-ethyl-1,3-hexanediol, and 2,2,4-trimethyl-1,3-pentanediol.

Examples of the polycarbonate diol include a reaction product of a diol and a carbonic acid ester, and examples of the carbonic acid ester when the polycarbonate diol is manufactured include dialkyl carbonates such as dimethyl carbonate, diethyl carbonate, dipropyl carbonate, and dibutyl carbonate; diaryl carbonates such as diphenyl carbonate; and alkylene carbonates such as ethylene carbonate, trimethylene carbonate, 1,2-propylene carbonate, 1,2-butylene carbonate, 1,3-butylene carbonate, and 1,2-pentylene carbonate.

Examples of the polyether diol include an alkylene oxide adduct of one or more kinds of the low molecular diol (such as ethylene oxide, propylene oxide, butylene oxide, and a mixture of two or more kinds thereof) and a ring-opening polymer of an alkylene oxide, and specific examples thereof include diethylene glycol, dipropylene glycol, and dioxytetramethylene glycol.

Examples of the castor oil-based diol include castor oil fatty acid ester-based diol. Specific examples thereof include: castor oil; a castor oil fatty acid ester obtained by a transesterification reaction between castor oil and the low molecular diol or a diether polyol; or a castor oil fatty acid ester obtained by an esterification reaction of castor oil fatty acid with the low molecular diol or a diether polyol.

Examples of the polyester diol include: linear or branched polyester diols obtained from polycarboxylic acids [aliphatic saturated or unsaturated polycarboxylic acids (adipic acid, azelaic acid, dodecanoic acid, maleic acid, fumaric acid, itaconic acid, sebacic acid, dimer acid, dimerized linoleic acid, and the like) and/or aromatic dicarboxylic acids (phthalic acid, isophthalic acid, and the like)] and diols (the low molecular diol and/or diether polyol); polylactone diols [for example, polyols (for example, polycaprolactone diol) obtained by addition polymerization of (substituted) caprolactone (ε-caprolactone, α-methyl-ε-caprolactone, ε-methyl-ε-caprolactone, and the like) to one or more kinds of the low molecular diols as an initiator in the presence of a catalyst (an organometallic compound, a metal chelate compound, a fatty acid metal acylate, and the like)]; polyether ester diols obtained by addition polymerization of an alkylene oxide (ethylene oxide, propylene oxide, or the like) to a polyester having a carboxyl group and/or an OH group at the end; and polycarbonate polyols.

Among these, the divalent organic group of $R^6$ is preferably a polyester diol residue (specifically, a residue obtained by removing two hydroxy groups from an adipic acid ester-based polyol, a sebacic acid ester-based polyol, or a dimer acid ester-based polyol), a polyether diol residue, and a polycarbonate diol residue (specifically, —O—C(=O)—O—(CH$_2$)—, n=3, 4) in view of flexibility, and is preferably a butanediol residue and a castor oil-based diol residue (a residue obtained by removing two hydroxy groups from a castor oil-based structure) in view of insulating properties.

In the formula (1), n is an integer of 1 to 3. In the present embodiment, since the number of functional groups of the carbodiimide of the polycarbodiimide compound is preferably 2 or more in terms of obtaining a crosslinking substance, the above effect can be achieved by the fact that n is 1 or more.

In other words, the number of functional groups of the carbodiimide is 2 to 4, and the number of functional groups of the carbodiimide is more preferably 2 to 3 in view of the bending properties and low rebound properties of the cured product.

In the present embodiment, as a preferable polycarbodiimide compound, in the formula (1), both $R^1$ and $R^2$ are an ethyl group, an isopropyl group, an n-butyl group, or a sec-butyl group, $X^1$ and $X^2$ each represent —$R^3$—NH—COOR$^4$, $R^3$ represents a divalent residue of 4,4'-diphenylmethane diisocyanate, 2,4-tolylene diisocyanate or 2,6-tolylene diisocyanate, and $R^4$ represents a residue obtained by removing a hydroxy group from a hydroxymethyl group or a hydroxyethyl group, $X^1$ and $X^2$ may be the same as or different from each other, and Y represents —$R^5$—NHCOO—$R^6$—OCOHN—$R^5$, $R^5$ each independently represent a divalent residue of 4,4'-diphenylmethane diisocyanate, 2,4-tolylene diisocyanate, or 2,6-tolylene diisocyanate, $R^6$ represents a castor oil-based diol residue, a butanediol residue, a polyester diol residue, and a polyether diol residue, and n is an integer of 1 to 3. The preferable polycarbodiimide compound is also referred to as "polycarbodiimide compound group A".

In the present invention, a weight average molecular weight of the polycarbodiimide compound is 400 to 5,000. It is preferable that the weight average molecular weight of the polycarbodiimide compound is 400 or more since low rebound properties can be exhibited, and it is preferable that the weight average molecular weight of the polycarbodiimide compound is 5,000 or less since development is possible.

The weight average molecular weight of the polycarbodiimide compound is more preferably 600 or more, still more preferably 800 or more in view of bending properties and low rebound properties of the cured product, and is more preferably 4,000 or less, still more preferably 3,000 or less in view of development time.

In the present invention, the weight average molecular weight is a value measured by polystyrene conversion using gel permeation chromatography.

In the present invention, a carbodiimide equivalent of the polycarbodiimide compound is 180 to 2,500. When an equivalent number of the carbodiimide is 180 or more, bending properties and low rebound properties of the cured product after heating are improved, and adhesion properties to various adherends such as copper foil and polyimide is also improved. When the equivalent number of the carbodiimide is 2,500 or less, heat resistance can be sufficiently provided. The equivalent number of the carbodiimide is more preferably 200 or more, still more preferably 400 or more, and particularly preferably more than 600 in view of bending properties and low rebound properties of the cured product, and is more preferably 2,000 or less, still more preferably 1,500 or less in view of heat resistance. Specifically, from the above viewpoints, the carbodiimide equivalent is more preferably 200 to 2,500, still more preferably 400 to 2,000, and particularly preferably more than 600 and 1,500 or less.

As a method for manufacturing the polycarbodiimide compound of the present embodiment, for example, a carbodiimide monomer containing at least two isocyanate groups in one molecule is reacted with a polyol having a hydroxy group at the molecular end to obtain polycarbodiimide; the obtained polycarbodiimide is reacted with a hydroxy group-containing monomer to seal the terminal isocyanate group of the polycarbodiimide; and the terminal sealed polycarbodiimide is reacted with an amine to protect the carbodiimide group with an amino group.

Polycarbodiimide is obtained by a known method, and can be produced by, for example, a method disclosed in JP-A-2007-138080.

By the above method, the polycarbodiimide compound of the present invention in which the carbodiimide group is protected with an amino group can be obtained.

An amount of the polycarbodiimide compound is preferably used such that the carbodiimide equivalent of the polycarbodiimide compound is 0.5 to 1.5 equivalents with respect to the carboxyl group of the photosensitive prepolymer. When the carbodiimide equivalent is 0.5 or more with respect to a carboxyl group equivalent 1, excellent low rebound properties can be imparted to the obtained cured product while storage stability of the dry film is improved, and the heat resistance is also excellent. When the carbodiimide equivalent is 1.5 or less with respect to the carboxyl group equivalent 1, the storage stability of the dry film can be maintained. The carbodiimide equivalent is more preferably 0.6 or more and more preferably 1.3 or less, and still more preferably 1.2 or less. Specifically, the carbodiimide equivalent is more preferably 0.6 to 1.3, and still more preferably 0.6 to 1.2 with respect to the carboxyl group of the photosensitive prepolymer.

(Photopolymerizable Compound)

In the embodiment of the present invention, the photosensitive resin composition may contain a photopolymerizable compound.

The main component photopolymerizable compound in the present embodiment is not particularly limited unless photocrosslinking is possible, but a compound having an ethylenically unsaturated bond is preferably used. Examples of the compound having an ethylenically unsaturated bond in the molecule include a (meth)acrylate compound, a bisphenol A-based di(meth)acrylate compound, an epoxy acrylate compound, a modified epoxy acrylate compound, a fatty acid-modified epoxy acrylate compound, an amine-modified bisphenol A-based epoxy acrylate compound, a hydrogenated bisphenol A-based di(meth)acrylate compound, a di(meth)acrylate compound having a urethane bond in the molecule, a (meth)acrylate compound having a hydrophobic backbone in the molecule, a polyalkylene glycol di(meth)acrylate compound having both a (poly)oxyethylene chain and a (poly)oxypropylene chain in the molecule, a trimethylolpropane di(meth)acrylate compound, and a polyester acrylate compound. These can be used in one kind alone or in combination of two or more kinds.

Examples of the photopolymerizable compound preferably used in the present embodiment as commercially available ones include "EBECRYL-3708" and "EBECRYL-1039" (all trade names, manufactured by DAICEL-ALLNEX LTD.), and "R-684", "HX-220", and "HX-620" (all trade names, manufactured by Nippon Kayaku Co., Ltd.).

An amount of the photopolymerizable compound use is preferably 10 parts by mass or more, more preferably 20 parts by mass or more, and still more preferably 30 parts by mass or more, and preferably 60 parts by mass or less, more preferably 50 parts by mass or less, and still more preferably 40 parts by mass or less with respect to 100 parts by mass of the photosensitive prepolymer. When a content of the photopolymerizable compound is 10 parts by mass or more with respect to 100 parts by mass of the photosensitive prepolymer, a fine circuit pattern can be drawn since resolution at the time of producing an FPC can be improved; when the content of the photopolymerizable compound is 60 parts by mass or less, the photosensitive prepolymer is preferable since the cured film has flame retardancy and heat resistance.

(Colorant)

The photosensitive resin composition of the present invention preferably further contains a colorant. Since the colorant is contained, a shape and resolution of the pattern circuit can be controlled.

Examples of the colorant used in the present invention include an organic pigment and an inorganic pigment.

Examples of the organic pigment include organic pigments based on phthalocyanine, quinacridone, benzimidazolone, dioxazine, indanthrene, perylene, azo, quinophthalone, anthraquinone, aniline, and cyanine.

Examples of the inorganic pigment include carbon black, titanium black, ultramarine blue, Prussian blue, yellow lead, zinc yellow, red lead, iron oxide red, zinc white, lead white, lithopone, and titanium dioxide.

These may be used in one kind alone or in combination of two or more kinds. Among them, the organic pigment is preferably used in view of insulating properties.

For example, when a black solder resist film is required, a black pigment is preferably contained as a colorant.

Examples of the black pigment include titanium black, carbon black, carbon nanotubes, acetylene black, aniline black, perylene black, strontium titanate, chromium oxide, and cerium oxide.

The colorant is preferably used as a dispersion. The dispersion can be prepared by adding a composition obtained by mixing the colorant and a dispersant in advance to an organic solvent (or vehicle) and dispersing the mixture. The vehicle refers to a portion of a medium in which a pigment is dispersed when coating material is in a liquid state, and includes a portion (binder) that is in a liquid state and binds to the pigment to harden a coating film and a component (organic solvent) that dissolves and dilutes the binder.

The colorant used in the present invention preferably has a number average particle diameter of 0.001 to 0.1 μm, and more preferably 0.01 to 0.08 μm in view of dispersion stability. Here, the "particle diameter" refers to a diameter of a circle having the same area as an electron micrograph image of the particle, and the "number average particle diameter" refers to an average value of 100 particle diameters determined for a great number of particles.

The amount of the colorant used is preferably 0.2 to 3 parts by mass, and more preferably 0.5 to 2 parts by mass in a solid content with respect to 100 parts by mass of the photosensitive prepolymer. The content of the black pigment when the black solder resist film is produced is preferably 1 to 10 parts by mass, and more preferably 3 to 7 parts by mass in a solid content with respect to 100 parts by mass of the photosensitive prepolymer. When the content of the colorant is too small, a problem tends to occur that a desired shape cannot be drawn by scattering of exposure light during pattern formation (or patterning); when the content of the colorant is too large, the exposure light does not reach the bottom of the film during photocuring, an uncured portion may occur inside the film, and the pattern formation may become poor due to erosion of the cured film during etching. Therefore, the content of the colorant is preferably in the above range.

(Other Components)

The photosensitive resin composition of the present invention can contain other components in a range not impairing the desired effects of the present invention. Examples of other components can include a flame retardant, a plasticizer, and a filler.

Examples of the flame retardant include an organic phosphinic flame retardant, a metal oxide, a phosphoric ester, a phosphazene compound, melamine and a salt of heat condensate thereof and polyphosphoric acid, and a compound of melamine and isocyanuric acid.

Examples of the plasticizer include p-toluenesulfonamide.

Examples of the filler include silica, alumina, talc, calcium carbonate, and barium sulfate.

These components may be used in one kind alone or in combination of two or more kinds.

An amount of these components used is preferably 5 to 60 parts by mass, and more preferably 20 to 40 parts by mass with respect to 100 parts by mass of the photosensitive prepolymer.

(Production of Photosensitive Resin Composition)

A method of producing the photosensitive resin composition of the present invention can be produced by a conventionally known method, and is not particularly limited. For example, the photosensitive prepolymer can be produced by sequentially mixing the photopolymerization initiator, the thermal curing agent, and other arbitrary components.

A mixing step can be performed using a mixer such as a bead mill or a roll mill.

The photosensitive resin composition of the present invention may be in a form of liquid or a film. The film form photosensitive resin composition can be formed, for example, by applying the photosensitive resin composition of the present invention on a mold release treated film and removing the solvent contained in the resin composition at a predetermined temperature. A coating method can be appropriately selected depending on a desired thickness, such as a comma coater, a gravure coater, and a die coater.

Glass transition temperature after thermal curing of the photosensitive resin composition of the present invention is usually 100° C. or lower, and more preferably 50° C. to 90° C. When the glass transition temperature after thermal curing is 100° C. or lower, flexibility of the cured product is good, and the low rebound properties of the flexible printed circuit can be improved when the cured product is used in a flexible printed curcuit.

In the photosensitive resin composition of the present invention, tensile elastic modulus at 23° C. after thermal curing is preferably 2 GPa or less. When the tensile elastic modulus at 23° C. after thermal curing is 2 GPa or less, since the resin composition has flexibility, excellent low rebound properties, which are the desired effects of the present invention, can be realized. A lower limit of the tensile elastic modulus at 23° C. after thermal curing is not particularly limited, but is preferably 2 GPa or less.

(Photosensitive Film)

The photosensitive film of the present invention includes a support and a photosensitive resin composition layer formed on the support, and the photosensitive resin composition layer contains the photosensitive resin composition. The photosensitive film may have a protective film layer on a surface of the photosensitive resin composition layer opposite to the support.

According to the photosensitive film according to the present embodiment, it is possible to easily form a solder resist film having excellent flexibility and little rebound after bending after curing the photosensitive film.

A method for producing the photosensitive film is described below.

In the photosensitive resin composition layer, the photosensitive resin composition of the present invention is dissolved in solvent such as methanol, ethanol, acetone, methyl ethyl ketone, methyl cellosolve, ethyl cellosolve, toluene, N,N-dimethylformamide, and propylene glycol monomethyl ether, or a mixed solvent thereof, a solution having a solid content of about 30 to 70 mass % is obtained, and the photosensitive resin composition layer is preferably formed by coating the solution on the support.

Examples of the support include a polymer film having heat resistance and solvent resistance such as polyester such as polyethylene terephthalate, polypropylene, and polyethylene. A surface of the support on which the resin composition is coated is preferably subjected to a mold release treatment.

A thickness of the support can be appropriately selected from application and a thickness of the resin composition.

The thickness of the photosensitive resin composition layer varies depending on the application, but is preferably 5 to 100 μm, and more preferably 10 to 50 μm in terms of the thickness after drying in which the solvent is removed by heating and/or hot air blowing.

Examples of the protective film include a polyethylene film, a polypropylene film, and polyethylene terephthalate.

The photosensitive film of the present invention can be stored as it is, and has storage stability of about 2 weeks or more at room temperature (23° C.).

The photosensitive film of the present invention can be used for forming a resist pattern. The resist pattern can be manufactured by a manufacturing method including, for example: a lamination step of laminating the photosensitive film on a circuit forming substrate; an exposure step of irradiating a predetermined portion of the photosensitive resin composition layer with active rays to form a cured portion in the photosensitive resin composition layer; a developing step of removing the photosensitive resin composition layer other than the cured portion; and a thermal curing step of curing the cured portion of the photosensitive resin composition layer by heating.

When the photosensitive film has a protective film, the manufacturing method includes a step of removing the protective film from the photosensitive film.

The circuit forming substrate includes an insulating layer, and a conductor layer (composed of copper, copper-based alloys, nickel, chromium, iron, iron-based alloys such as stainless steel, preferably copper and copper-based alloys) formed on the insulating layer, and the photosensitive resin composition layer of the photosensitive film is laminated on the conductor layer side of the circuit forming substrate in the lamination step.

Examples of a lamination method of the photosensitive film in the lamination step include a method of laminating by compressing the photosensitive resin composition layer on the circuit forming substrate while heating the photosensitive resin composition layer. In a case of lamination in this manner, the photosensitive resin composition layer is preferably laminated under reduced pressure in view of adhesion, trackability, and the like.

In the lamination step, the photosensitive resin composition layer is preferably heated at a temperature of 30° C. or higher and lower than 80° C., a compression pressure is preferably about 0.1 to 2.0 MPa, and a pressure of the surrounding atmosphere is preferably 3 hPa or less. Since the amino group of the polycarbodiimide compound in the photosensitive resin composition is dissociated from the carboxyl group at the heating temperature of 80° C. or more, the lamination step is performed at a temperature lower than the dissociation temperature.

In the exposure step, a predetermined portion of the photosensitive resin composition layer is irradiated with active rays to form a cured portion. Examples of a method for forming the cured portion include a method of irradiating with the active rays in an image form via a negative or positive mask pattern called an artwork. Further, exposure by a direct drawing method without a mask pattern such as a Laser Direct Imaging (LDI) method and a Digital Light Processing (DLP) (registered trademark) exposure method is also possible. In this case, when the support present on the photosensitive resin composition layer is transparent, the active rays can be directly irradiated. When the support is opaque, the photosensitive resin composition layer is irradiated with the active rays after the support is removed.

As a light source of the actinic rays, a known light source, for example, a light source that radiates ultraviolet effectively such as a carbon arc lamp, a mercury vapor arc lamp, an extra-high pressure mercury lamp, a high pressure mercury lamp, a xenon lamp, and a semiconductor laser can be used. Further, a light source that effectively radiates visible light such as a photographic flood electric bulb and a solar lamp can be used.

Next, when the support is present on the photosensitive resin composition layer, the photosensitive resin composition layer other than the curing portion is removed and developed by wet development, dry development, or the like in the development step after the support is removed to form the resist pattern.

In a case of wet development, the photosensitive resin composition layer can be developed by a known method such as spraying, swinging immersion, brushing, and scratching using a developer such as an aqueous alkaline solution. The developer is safe and stable, and preferably has good operability, for example, a dilute solution of sodium carbonate at 20° C. to 50° C. (1 to 5 mass % of aqueous solution) is used.

When the resist pattern obtained by the above forming method is used as, for example, the solder resist film of the flexible printed circuit, a thermal curing step is performed after the development step. By the thermal curing step, the amino group of the polycarbodiimide compound in the photosensitive resin composition of the photosensitive resin composition layer is dissociated, and the cured film can be formed.

Examples of a heating method can include heating by an oven. Heating is preferably performed at a temperature of 80° C. or higher for 20 to 120 minutes. Since the amino group of the polycarbodiimide compound is dissociated at 80° C. or higher, it is possible to dissociate the amino group from the carbodiimide group by heating at 80° C. or higher to react with the carboxyl group of the photosensitive prepolymer and cured. An upper limit of the heating temperature is not particularly limited, but is preferably, for example, 200° C. or lower in view of work efficiency.

When a test piece of a flexible printed circuit board having a width of 10 mm and a length of 100 mm, in which the solder resist film having a thickness of 25 μm is laminated on both sides of a flexible copper-clad laminate in which circuit patterns each having a copper thickness of 18 μm are provided on both sides of polyimide having a thickness of 25 μm, is subjected to a repulsion resistant test in which the test piece is bent 180°, a load of 1000 g is applied on the test piece for 10 seconds, and the test piece is left to stand at 23° C. for 1 hour after the road is released, a rebound angle of the test piece is 20° or less when the rebound angle in a bent state is defined as 0°.

When the rebound angle of the test piece at repulsion resistant test is 20° or less, it is possible to maintain the bent state almost without rebounding. A range in which the rebound angle is preferable is 10° C. or less. Therefore, the cured film composed of the cured product of the photosensitive resin composition of the present invention has excellent flexibility and low rebound properties, and thus can be suitably used for the flexible printed circuit.

(Flexible Printed Circuit)

By the above method, the flexible printed circuit (FPC) in which a wiring pattern and a solder resist layer are formed in this order on the insulating layer is obtained, and a structure called acylurea is formed in the solder resist layer by a reaction between the carbodiimide group and the carboxyl group. In the present invention, the FPC may further include a shield layer containing a conductive material on the solder resist layer.

Examples of a shield layer include a shield layer having a trilaminar structure of an insulating layer/a metal layer/a conductive adhesive layer, and a commercially available shield film can be used.

Examples of conductive material constituting the shield layer include metal. Examples of metal include gold, silver, copper, aluminum, nickel, and alloys thereof.

(Image Display Device)

The image display device of the present invention includes the flexible printed circuit (FPC) of the present invention. Examples of the image display device of the present invention include a liquid crystal display substrate having a liquid crystal display unit on a surface thereof in a liquid crystal panel display, and a printed circuit board provided with a drive circuit of the liquid crystal display substrate, and a flexible printed circuit (FPC) for electrically connecting the liquid crystal display substrate with the printed circuit board, and the flexible printed circuit of the present invention is used as the FPC.

One surface of the liquid crystal display substrate forms a liquid crystal display unit by enclosing a liquid crystal for forming a display area composed of a great number of pixel arrays between two insulating substrates based on glass. The printed circuit board is a so-called control substrate on which a control IC driving and controlling a touch sensor module is mounted.

One end of the flexible printed circuit (FPC) of the present invention adheres to the liquid crystal display substrate and the other end adheres to the printed circuit board, and the liquid crystal display substrate and the printed circuit board are electrically connected by the FPC of the present invention.

When mounted to these cases, the FPC of the present invention is folded back, and the printed circuit board faces a back surface side of the liquid crystal display substrate, that is, a surface of the liquid crystal display substrate on a side opposite to the liquid crystal display unit. Since the FPC of the present invention has excellent low rebound properties, a state in which the FPC is folded back and plastically deformed in a U shape can be maintained, so that no stress is applied to the liquid crystal display unit, no separation from the liquid crystal substrate occurs, and no display spot occurs on the liquid crystal display unit. Even after mounting, since there is no rebound against external stress, it is possible to suppress occurrence of the display spot on the liquid crystal display unit, and no separation from the adhesive portion occurs.

EXAMPLES

Hereinafter, the present invention will be described in detail according to Examples and Comparative Examples, but the present invention is not limited thereto.

Example, Comparative Examples (i) Production of Photosensitive Resin Composition Components were blended at blending ratios shown in Tables 2 and 3 and mixed with a mixer to obtain a photosensitive resin composition used in Examples 1 to 15 and Comparative Examples 1 to 2. Polycarbodiimides shown in Tables 2 and 3 are those described in Table 1, which correspond to the polycarbodiimide compound group A. The number of equivalents of polycarbodiimide in Tables 2 and 3 represents the number of equivalents of carbodiimide groups to carboxyl groups contained in the photosensitive prepolymer.

(ii) Production of Dry Film

The photosensitive resin composition obtained in the above (i) was applied onto a polyethylene terephthalate (PET) film having a thickness of 25 μm such that the photosensitive resin composition after drying has a thickness of 25 μm, and dried at 80° C. for 5 minutes, and then a polyethylene film was pasted on a coated surface side to obtain a dry film.

<Measurement of Glass Transition Point (Tg)>

The polyethylene film of the dry film produced above was peeled off and the dry film was vacuum laminated to a mold release film. Vacuum lamination was carried out at a hot plate temperature of 50° C. to 60° C., a pressing pressure of 0.5 to 1.0 MPa, pressing time of 10 to 20 seconds, and vacuum degree of 3 hPa or less. After the vacuum lamination, an extra-high pressure mercury lamp irradiated the dry film with ultraviolet rays of 200 mJ/cm$^2$. After irradiation, a PET film was peeled off, and development was performed with 1 wt % of an aqueous sodium carbonate solution at 30° C. for 60 seconds at a spray pressure of 0.18 MPa. After the development, a high pressure mercury lamp irradiated with the ultraviolet rays of 1,000 mJ/cm$^2$. After the irradiation, the dry film was cured at 150° C. for 90 minutes with a hot air circulating drier. After the curing, a dry film was peeled off from the mold release film to obtain a single dry film. A glass transition point (Tg) of the obtained single dry film was measured by DMA ("RSA-G2" manufactured by TA Instruments). The results are shown in Tables 2 and 3.

<Measurement of Tensile Elastic Modulus>

The polyethylene film of the dry film produced above was peeled off and the dry film was vacuum laminated to the mold release film. Vacuum lamination was carried out at a hot plate temperature of 50° C. to 60° C., a pressing pressure of 0.5 to 1.0 MPa, pressing time of 10 to 20 seconds, and vacuum degree of 3 hPa or less. After the vacuum lamination, an extra-high pressure mercury lamp irradiated the dry film with ultraviolet rays of 200 mJ/cm$^2$. After irradiation, a PET film was peeled off, and development was performed with 1 wt % of an aqueous sodium carbonate solution at 30° C. for 60 seconds at a spray pressure of 0.18 MPa. After the development, a high pressure mercury lamp irradiated the dry film with the ultraviolet rays of 1,000 mJ/cm$^2$. After the irradiation, the dry film was cured at 150° C. for 90 minutes with a hot air circulating drier. After the curing, a dry film was peeled off from the mold release film to obtain a single dry film.

Next, the obtained single dry film was cut into a measurement sample size of 10 mm×140 mm, the single film was set such that a distance between jaw portions of a tensile tester ("Autograph" manufactured by Shimadzu Corporation) is 100 mm, and was pulled until the single film was broken at a pulling speed of 50 mm/min. The tensile elastic modulus (unit GPa) was calculated from an initial gradient of a chart obtained at this time. The results are shown in Tables 2 and 3.

The obtained dry film was subjected to the following storage stability test, low repellent force test, and heat resistance test. The results are shown in Tables 2 and 3.

<Storage Stability Test>

(1) Sample Production Procedure

The dry film kept in a dark place at 230 for a certain period was used. The polyethylene film of the dry film was peeled off and the dry film was pasted to a rolling copper foil having a thickness of 35 μm by vacuum lamination to produce a test piece. Vacuum lamination was carried out at a hot plate temperature of 50° C. to 60° C., a pressing pressure of 0.5 to 1.0 MPa, pressing time of 10 to 20 seconds, and vacuum degree of 3 hPa or less.

(2) Measurement Method and Determination Criteria

The extra-high pressure mercury lamp irradiated the dry film with the ultraviolet rays of 200 mJ/cm$^2$ via a photomask on which a predetermined pattern (φ100 μm) is formed. After the irradiation, the PET film was peeled off, and the dry film was developed with 1 wt % of an aqueous sodium carbonate solution at 30° C. for 60 to 120 second at a spray pressure of 0.18 MPa. Resolution was evaluated by the following criteria.

[Evaluation Criteria]

◎: After storage at 23° C. for 4 weeks or more, a resolution of φ100 μm was obtained, and no development residue was obtained.

○: After storage at 23° C. for 3 weeks or more, a resolution of φ100 μm was obtained.

Δ: After storage at 23° C. for 2 weeks or more, a resolution of φ100 μm was obtained.

x: In storage at 23° C. for less than 2 weeks, a resolution of φ100 μm was not obtained.

Since storage stability of Example 14 was not developed in the development of 60 to 120 seconds, evaluation was not performed.

<Repellent Force Resistant Test>

(1) Sample Production Procedure

A flexible copper-clad laminate ("PKRW 1018 RAH" manufactured by Arisawa Manufacturing Co., Ltd.) provided with a straight circuit pattern having a copper body thickness of 18 μm, a line width of 75 μm, and a space width of 75 μm was prepared on both sides of a polyimide having a thickness of 25 μm. The polyethylene films of the dry films produced above were peeled off and the dry films were pasted to both surfaces of the flexible copper-clad laminate by vacuum lamination. Vacuum lamination was carried out at a hot plate temperature of 50° C. to 60° C., a pressing pressure of 0.5 to 1.0 MPa, pressing time of 10 to 20 seconds, and vacuum degree of 3 hPa or less. After the vacuum lamination, an extra-high pressure mercury lamp irradiated the dry films with ultraviolet rays of 200 mJ/cm². After irradiation, PET films were peeled off, and development was performed with 1 wt % of an aqueous sodium carbonate solution at 30° C. for 60 seconds at a spray pressure of 0.18 MPa. After the development, a high pressure mercury lamp irradiated the dry films with the ultraviolet rays of 1,000 mJ/cm². After the irradiation, the dry films were cured at 150° C. for 90 minutes with a hot air circulating drier to produce the test piece.

(2) Measurement Method and Determination Criteria

The produced test piece (thickness 0.118 mm×width 10 mm×length 100 mm) was bent 180° so that a fold orthogonal to the circuit pattern is attached, and a load of 1,000 g was applied for 10 seconds. The test piece stood at 23° C. for 1 hour after the load was released, and then a rebound angle, which was set to 0° at a bent state, of the test piece enlarged naturally by rebound was measured. Evaluation criteria are as follows.

[Evaluation Criteria]

◎: 0° (No spread of test piece)
○: more than 0° and less than 20°
Δ: 20° or more and less than 60°
x: 600 or more <Heat Resistance Test>

(1) Sample Production Procedure

The polyethylene film of the dry film was peeled off and the dry film was pasted to a rolling copper foil having a thickness of 35 μm by vacuum lamination. Vacuum lamination was carried out at a hot plate temperature of 50° C. to 60° C., a pressing pressure of 0.5 to 1.0 MPa, pressing time of 10 to 20 seconds, and vacuum degree of 3 hPa or less. After the vacuum lamination, an extra-high pressure mercury lamp irradiated the dry film with ultraviolet rays of 200 mJ/cm². After irradiation, a PET film was peeled off, and development was performed with 1 wt % of an aqueous sodium carbonate solution at 30° C. for 60 seconds at a spray pressure of 0.18 MPa. After the development, a high pressure mercury lamp irradiated the dry film with the ultraviolet rays of 1,000 mJ/cm². After the irradiation, the dry film was cured at 150° C. for 90 minutes with a hot air circulating drier to produce the test piece.

(2) Measurement Method and Determination Criteria

Solder was fed into a solder bath, and solder liquid set to 260° C., 270° C., 280° C., 290° C., and 300° C. was prepared. The test piece was immersed in an order from the solder liquid set to 260° C. for 1 minute, and it was visually confirmed whether there was swelling or peeling in the removed test piece. Heat resistance was evaluated based on the following evaluation criteria by the temperature at which swelling or peeling occurred in the test piece.

[Evaluation Criteria]

◎: No swelling or peeling in the test piece even if a temperature of the solder liquid is 300° C.
○: Swelling or peeling occurs in the test piece when a temperature of the solder liquid is 280° C. or 290° C.
Δ: Swelling or peeling occurs in the test piece when a temperature of the solder liquid is 270° C.
x: Swelling or peeling occurs in the test piece when a temperature of the solder liquid is 260° C.

Regarding a heat resistance test of Example 15, since a reaction between the photosensitive prepolymer and the polycarbodiimide was not advanced or cured in the dry film, the heat resistance test was not performed.

TABLE 1

| | | | Kinds of Polycarbodiimide | | | |
|---|---|---|---|---|---|---|
| | Weight average molecular weight | Equivalent (g/eq) | Kind of amino group | Structure of amino group | Dissociation start temperature of amino group | Kind of $R^6$ in formula (1) |
| A | 400 | 200 | Secondary amino group | Diisopropylamine | 110° C. | Ester |
| B | 2,000 | 1,000 | Secondary amino group | Diisopropylamine | 110° C. | Ester |
| C | 5,000 | 2,500 | Secondary amino group | Diisopropylamine | 110° C. | Ester |
| D | 2,000 | 1,000 | Secondary amino group | Diethylamine | 80° C. | Ester |
| E | 2,000 | 1,000 | Secondary amino group | Di-sec-butylamine | 150° C. | Ester |
| F | 2,000 | 1,000 | Secondary amino group | Diisopropylamine | 110° C. | Carbonate |
| G | 2,000 | 1,000 | Secondary amino group | Diisopropylamine | 110° C. | Ether |
| H | 2,000 | 1,000 | Secondary amino group | Diisopropylamine | 110° C. | Butadiene |
| I | 6,000 | 3,000 | Secondary amino group | Diisopropylamine | 110° C. | Ester |
| J | 2,000 | 1,000 | Secondary amino group | Di-n-butylamine | 160° C. | Ester |
| K | 300 | 150 | Secondary amino group | Diisopropylamine | 110° C. | Ester |
| L | 2,000 | 1,000 | Secondary amino group | N-ethylmethylamine | 70° C. | Ester |

TABLE 2

|  |  |  | Example 1 | Example 2 | Example 3 | Example 4 | Example 5 | Example 6 | Example 7 | Example 8 | Example 9 |
|---|---|---|---|---|---|---|---|---|---|---|---|
| Composition | Photosensitive prepolymer (A) |  | 100 | 100 | 100 | 100 | 100 | 100 | 100 | 100 | 100 |
|  | Polycarbodiimide (Upper stage is the number of equivalents, and lower stage is the number of addition parts) | A | 1.0 eq 35.7 | 1.0 eq 35.7 |  |  |  |  |  |  |  |
|  |  | B |  |  | 1.0 eq 178.6 | 0.5 eq 89.3 | 0.6 eq 107.1 | 1.2 eq 214.3 | 1.3 eq 232.1 |  |  |
|  |  | C |  |  |  |  |  |  |  | 1.0 eq 446.4 |  |
|  |  | D |  |  |  |  |  |  |  |  | 1.0 eq 178.6 |
|  | Photopolymerization initiator (B) |  | 10 | 10 | 10 | 10 | 10 | 10 | 10 | 10 | 10 |
|  | Photopolymerizable compound (C) |  | 30 | 30 | 30 | 30 | 30 | 30 | 30 | 30 | 30 |
|  | Colorant (D) |  | 0 | 5 | 0 | 0 | 0 | 0 | 0 | 0 | 0 |
| Evaluation | Glass transition point of cured product (Tg) (°C.) |  | 85 | 85 | 65 | 50 | 55 | 75 | 80 | 55 | 65 |
|  | Tensile elastic modulus (GPa) |  | 1.5 | 1.5 | 0.8 | 0.6 | 0.7 | 1.2 | 1.0 | 0.7 | 0.8 |
|  | Storage stability |  |  |  |  |  |  | ○ | △ |  |  |
|  | Low rebound properties |  | ○ | ○ |  |  |  |  |  |  |  |
|  | Heat resistance |  |  |  |  | △ | ○ |  |  | ○ |  |

Notes)
(A): Carboxylic acid modified bisphenol type epoxy acrylate: Mw = 12,000, acid value = 100 mg KOH/g
(B): 2,4,6-trimethyl benzoyl diphenylphosphine oxide
(C): "EBECRYL-3708" manufactured by DAICEL-ALLNEX LTD. (Trade name) (Mw = 1,500, bifunctional)
(D): Black pigment "Lumogen black FK4281" (Trade name) manufactured by BASF Corporation

TABLE 3

|  |  |  | Example 10 | Example 11 | Example 12 | Example 13 | Example 14 | Example 15 | Comparative Example 1 | Comparative Example 2 |
|---|---|---|---|---|---|---|---|---|---|---|
| Composition | Photosensitive prepolymer (A) |  | 100 | 100 | 100 | 100 | 100 | 100 | 100 | 100 |
|  | Polycarbodiimide (Upper stage is the number of equivalents, and lower stage is the number of addition parts) | E | 1.0 eq 178.6 |  |  |  |  |  |  |  |
|  |  | F |  | 1.0 eq 178.6 |  |  |  |  |  |  |
|  |  | G |  |  | 1.0 eq 178.6 |  |  |  |  |  |
|  |  | H |  |  |  | 1.0 eq 178.6 |  |  |  |  |
|  |  | I |  |  |  |  | 1.0 eq 535.7 |  |  |  |
|  |  | J |  |  |  |  |  | 1.0 eq 178.6 |  |  |
|  |  | K |  |  |  |  |  |  | 1.0 eq 26.79 |  |
|  |  | L |  |  |  |  |  |  |  | 1.0 eq 178.6 |
|  | Photopolymerization initiator (B) |  | 10 | 10 | 10 | 10 | 10 | 10 | 10 | 10 |
|  | Photopolymerizable compound (C) |  | 30 | 30 | 30 | 30 | 30 | 30 | 30 | 30 |
|  | Colorant (D) |  | 0 | 0 | 0 | 0 | 0 | 0 | 0 | 0 |
| Evaluation | Glass transition point of cured product (Tg) (°C.) |  | 65 | 65 | 60 | 65 | 50 | 50 | 90 | 65 |
|  | Tensile elastic modulus (GPa) |  | 0.8 | 0.8 | 0.7 | 0.8 | 0.6 | 0.6 | 2.5 | 0.8 |
|  | Storage stability |  |  |  |  |  | — |  |  | x |
|  | Low rebound properties |  |  |  |  |  |  |  | △ |  |
|  | Heat resistance |  |  |  |  |  | △ | — |  |  |

Notes)
(A): Carboxylic acid modified bisphenol type epoxy acrylate: Mw = 12,000, acid value = 100 mg KOH/g
(B): 2,4,6-trimethyl benzoyl diphenylphosphine oxide
(C): "EBECRYL-3708" manufactured by DAICEL-ALLNEX LTD. (Trade name) (Mw = 1,500, bifunctional)
(D): Black pigment "Lumogen black FK4281" (Trade name) manufactured by BASF Corporation From the results of Tables 2 and 3, any of Examples had excellent storage stability for two weeks or more, there was almost no rebound after bending when formed into a film form, and it was possible to maintain the bent shape nearly as it is. In contrast, Comparative Examples were unable to achieve both storage stability and low rebound properties.

Although the present invention has been described in detail and with reference to particular embodiments, it will be apparent to those skilled in the art that various changes and modifications can be made without departing from the spirit and scope of the present invention. The present application is based on Japanese Patent Application No. 2016-225507 filed on Nov. 18, 2016, contents of which are incorporated herein by reference.

The invention claimed is:

1. A photosensitive resin composition comprising:

a photosensitive prepolymer having a carboxyl group and an ethylenically unsaturated group;

a photopolymerization initiator; and
a thermal curing agent,
wherein the thermal curing agent is a polycarbodiimide compound having a carbodiimide group, the carbodiimide group is protected by an amino group dissociated at a temperature of 80° C. or higher in the polycarbodiimide compound, and
the polycarbodiimide compound has a weight average molecular weight of 400 to 5,000 and a carbodiimide equivalent of 180 to 2,500.

2. The photosensitive resin composition according to claim 1, wherein the polycarbodiimide compound is represented by the following formula (1),

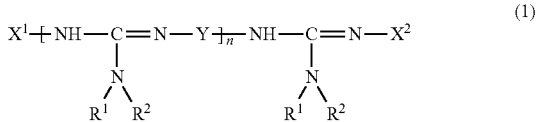
(1)

wherein, in the formula (1),
$R^1$ and $R^2$ are each independently a hydrogen atom, a linear or branched alkyl group having 1 to 6 carbon atoms, or a cycloalkyl group having 3 to 6 carbon atoms, $R^1$ and $R^2$ may be the same as or different from each other, but are not hydrogen atoms at the same time, $X^1$ and $X^2$ each represent —$R^3$—NH—COO$R^4$, $R^3$ is a divalent organic group having at least one aromatic group, $R^4$ is a residue obtained by removing a hydroxy group from an organic group having one hydroxy group, $X^1$ and $X^2$ may be the same as or different from each other,
Y represents —$R^5$—NHCOO—$R^6$—OCOHN—$R^5$—, $R^5$ are each independently a divalent organic group having at least one aromatic group, $R^6$ is a divalent organic group, and n represents an integer of 1 to 3.

3. The photosensitive resin composition according to claim 2, wherein, in the formula (1), $R^1$ and $R^2$ are each independently a linear or branched alkyl group having 1 to 6 carbon atoms or a cycloalkyl group having 3 to 6 carbon atoms.

4. The photosensitive resin composition according to claim 1, wherein the carbodiimide equivalent of the polycarbodiimide compound is 200 to 2,500.

5. The photosensitive resin composition according to claim 1, wherein the carbodiimide equivalent of the polycarbodiimide compound is 0.5 to 1.5 equivalents with respect to the carboxyl group of the photosensitive prepolymer.

6. The photosensitive resin composition according to claim 1, further containing a colorant.

7. The photosensitive resin composition according to claim 1, having a tensile elastic modulus at 23° C. after thermal curing of 2 GPa or less.

8. The photosensitive resin composition according to claim 1, wherein the photosensitive resin composition is used in a solder resist film.

9. A solder resist film formed using the photosensitive resin composition according to claim 1.

10. The solder resist film according to claim 9, wherein when a test piece of a flexible printed circuit board having a width of 10 mm and a length of 100 mm, in which the solder resist film having a thickness of 25 μm is laminated on both sides of a flexible copper-clad laminate in which circuit patterns each having a copper thickness of 18 μm are provided on both sides of polyimide having a thickness of 25 μm, is subjected to a repulsion resistant test in which the test piece is bent 180°, a load of 1000 g is applied on the test piece for 10 seconds, and the test piece is left to stand at 23° C. for 1 hour after the road is released, a rebound angle of the test piece is 20° or less when the rebound angle in a bent state is defined as 0°.

11. A flexible printed circuit containing the solder resist film according to claim 9.

12. An image display device comprising:
a liquid crystal display substrate having a liquid crystal display unit on a surface thereof;
a printed circuit board provided with a drive circuit of the liquid crystal display substrate; and
a flexible printed circuit for electrically connecting the liquid crystal display substrate with the printed circuit board,
wherein the printed circuit board is disposed on a back side of the liquid crystal display substrate,
the flexible printed circuit is the flexible printed circuit according to claim 11, is disposed in a state of being plastically deformed into a U shape, and one end thereof is connected to the printed circuit board and the other end thereof is connected to the liquid crystal display substrate.

* * * * *